US012761243B2

(12) United States Patent
Lee et al.

(10) Patent No.: US 12,761,243 B2
(45) Date of Patent: Oct. 13, 2026

(54) TEST SOCKET FOR PREVENTING SIGNAL LOSS

(71) Applicant: SAE HAN MICRO TECH CO., LTD., Namyangju-si (KR)

(72) Inventors: Jea Hyoung Lee, Hwaseong-si (KR); Suk Min Kim, Namyangju-si (KR); Jun Cheol Park, Namyangju-si (KR); Hak Jae Joo, Namyangju-si (KR)

(73) Assignee: SAE HAN MICRO TECH CO., LTD., Namyangju-si (KR)

( * ) Notice: Subject to any disclaimer, the term of this patent is extended or adjusted under 35 U.S.C. 154(b) by 142 days.

(21) Appl. No.: 18/885,887

(22) Filed: Sep. 16, 2024

(65) Prior Publication Data

US 2025/0004011 A1 Jan. 2, 2025

Related U.S. Application Data

(63) Continuation of application No. PCT/KR2023/003450, filed on Mar. 15, 2023.

(30) Foreign Application Priority Data

Mar. 22, 2022 (KR) ........................ 10-2022-0035417

(51) Int. Cl.
*G01R 1/04* (2006.01)

(52) U.S. Cl.
CPC ........... *G01R 1/0466* (2013.01); *G01R 1/045* (2013.01)

(58) Field of Classification Search
CPC ........ G01R 1/04; G01R 1/045; G01R 1/0466; G01R 29/08; G01R 31/28
See application file for complete search history.

(56) References Cited

U.S. PATENT DOCUMENTS

2010/0307798 A1* 12/2010 Izadian .................. H05K 1/142 174/255
2023/0288474 A1* 9/2023 Kim ..................... G01R 1/0466

FOREIGN PATENT DOCUMENTS

| | | | |
|---|---|---|---|
| JP | 2016505155 | A | 2/2016 |
| KR | 100375117 | B1 | 8/2003 |
| KR | 2020090006326 | U | 6/2009 |
| KR | 20170066981 | A | 6/2017 |
| KR | 101823006 | B1 | 1/2018 |

(Continued)

*Primary Examiner* — Judy Nguyen
*Assistant Examiner* — Adam S Clarke
(74) *Attorney, Agent, or Firm* — NKL Law; Jae Youn Kim

(57) ABSTRACT

Proposed is a test socket for preventing signal loss, and the test socket includes an insulating support part in a form of a plate, first conductive parts each provided with a plurality of first conductive particles arranged along a thickness direction of the insulating support part, the first conductive parts each having both end parts thereof respectively in contact with facing power or signal terminals, a second conductive part provided with a plurality of second conductive particles, configured to have both end parts thereof respectively in contact with facing ground terminals, and electrically separated from each first conductive part by the insulating support part, and shield parts each provided with a plurality of third conductive particles, configured to surround the respective first conductive parts, electrically separated from the respective first conductive parts by the insulating support part, and electrically connected to the second conductive part.

4 Claims, 3 Drawing Sheets

(56) References Cited

FOREIGN PATENT DOCUMENTS

| | | | | |
|---|---|---|---|---|
| KR | 102133675 | B1 | 7/2020 | |
| KR | 102137787 | B1 * | 7/2020 | ......... H01R 13/6581 |
| KR | 102357723 | B1 | 2/2022 | |
| KR | 20220027445 | A | 3/2022 | |

* cited by examiner

TEST SOCKET FOR PREVENTING SIGNAL LOSS

TECHNICAL FIELD

The present disclosure relates to a test socket used for measuring electrical characteristics of electrical elements.

BACKGROUND ART

When a semiconductor element is manufactured, a performance test is required for the manufactured semiconductor element. Testing of the semiconductor element requires a test socket electrically connecting contact pads of a test device to terminals of the semiconductor element.

Among test sockets, there is a test socket that is provided with an anisotropic conductive sheet including: contact parts of which the conductive particles are arranged in a thickness direction of silicone rubber; and an insulation part for insulating and supporting adjacent contact parts, and this test socket has advantages in that not only flexible connection is enabled by absorbing mechanical shock or deformation but also manufacturing cost is low.

FIG. 1 is a view illustrating a test socket of the related art. An anisotropic conductive sheet of the test socket of the related art is configured to include: contact parts 6 for contacting terminals 2 of a semiconductor element 1; and an insulation part 8 for insulating and supporting adjacent contact parts 6. An upper end part and a lower end part of each contact part 6 respectively contact a corresponding terminal 2 of the semiconductor element 1 and a corresponding contact pad 4 of a semiconductor test device 3, thereby electrically connecting the corresponding terminal 2 and contact pad 4 to each other. Each contact part 6 is a part that is solidified after mixing small spherical conductive particles 7 into a silicone resin, thereby acting as a conductor through which electricity flows.

However, since the insulation part 8 of such a test socket of the related art is made only of insulating material, interference between the contact parts 6 is unable to be avoided when high-frequency signals are transmitted, and thus there is a problem that the characteristics of high-frequency signal transmission are deteriorated.

DOCUMENT OF RELATED ART

Korean Publicized Utility Model No. 2009-0006326
Korean Patent Application Publication No. 10-2017-0066981
Korean Patent No. 10-0375117
Korean Patent No. 10-2133675

DISCLOSURE

Technical Problem

The present disclosure is proposed to improve the above-described problem, and an objective of the present disclosure is to provide a test socket for preventing signal loss in a novel structure in which accuracy is improved by minimizing signal loss at high frequencies.

Technical Solution

In order to achieve the objective described above, there is provided a test socket for preventing signal loss, the test socket being disposed between terminals facing each other to electrically connect the terminals to each other, and the test socket including: an insulating support part in a form of a plate; first conductive parts each provided with a plurality of first conductive particles arranged along a thickness direction of the insulating support part inside the insulating support part, the first conductive parts each having both end parts thereof respectively in contact with the facing power or signal terminals; a second conductive part provided with a plurality of second conductive particles arranged along the thickness direction of the insulating support part inside the insulating support part, the second conductive part having both end parts thereof respectively in contact with the facing ground terminals and being electrically separated from each first conductive part by the insulating support part; and shield parts each provided with a plurality of third conductive particles arranged along the thickness direction of the insulating support part inside the insulating support part, the shield parts surrounding the respective first conductive parts, being electrically separated from the respective first conductive parts by the insulating support part, and being electrically connected to the second conductive part.

In addition, the test socket for preventing signal loss, characterized by at least one surface of each first conductive part protruding outside the insulating support part, is provided.

In addition, the test socket for preventing signal loss, characterized by at least one surface of the second conductive part protruding outside the insulating support part, is provided.

In addition, the test socket for preventing signal loss, characterized by further including connection parts for electrically connecting the second conductive part and respective shield parts to each other, is provided.

In addition, the test socket for preventing signal loss, characterized by each connection part provided with a plurality of fourth conductive particles arranged along the thickness direction of the insulating support part, is provided.

In addition, the test socket for preventing signal loss, characterized by the insulating support part including a silicone-based resin or a polytetrafluoroethylene (PTFE)-based resin, is provided.

Advantageous Effects

The test socket for preventing signal loss according to the present disclosure minimizes the signal loss at high frequencies, whereby the accuracy is improved in high frequency inspection.

MODE FOR INVENTION

Figure 1:
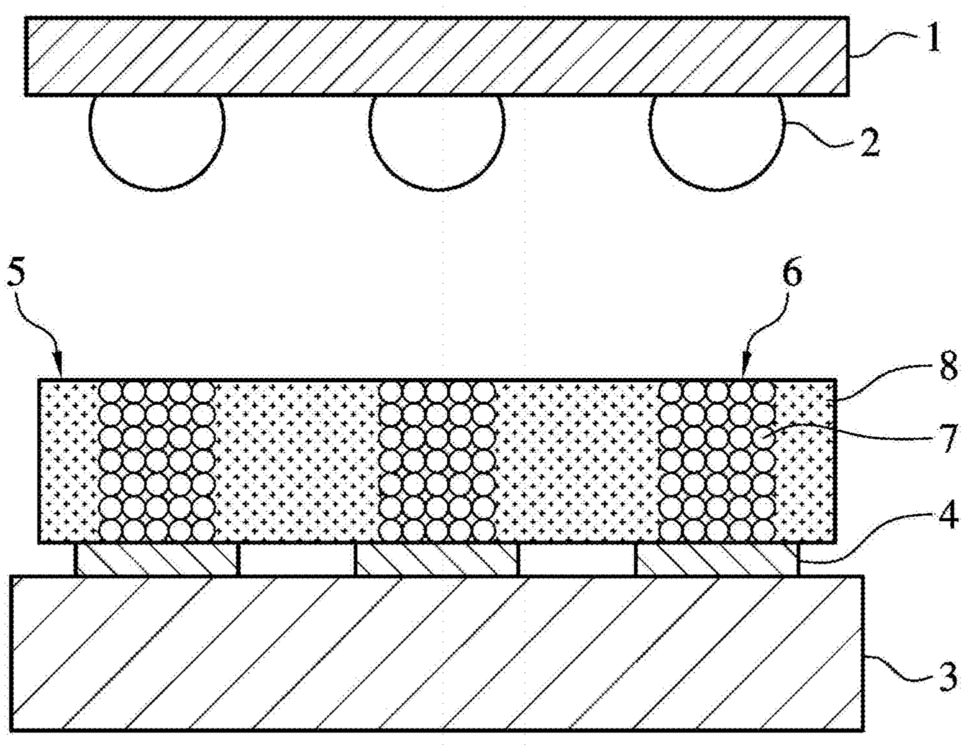
FIG. 1 is a view illustrating a test socket according to the related art.

Hereinafter, a preferred exemplary embodiment of the present disclosure will be described in detail on the basis of the attached drawings. The exemplary embodiment introduced below is provided as an example in order to sufficiently convey the spirit of the present disclosure to those skilled in the art. Therefore, the present disclosure is not limited to the exemplary embodiment described below and may be embodied in other forms. In addition, in the drawings, widths, lengths, thicknesses, etc. of components may be exaggerated for convenience of description. The same reference numbers throughout the present specification indicate the same components.

Figure 2:
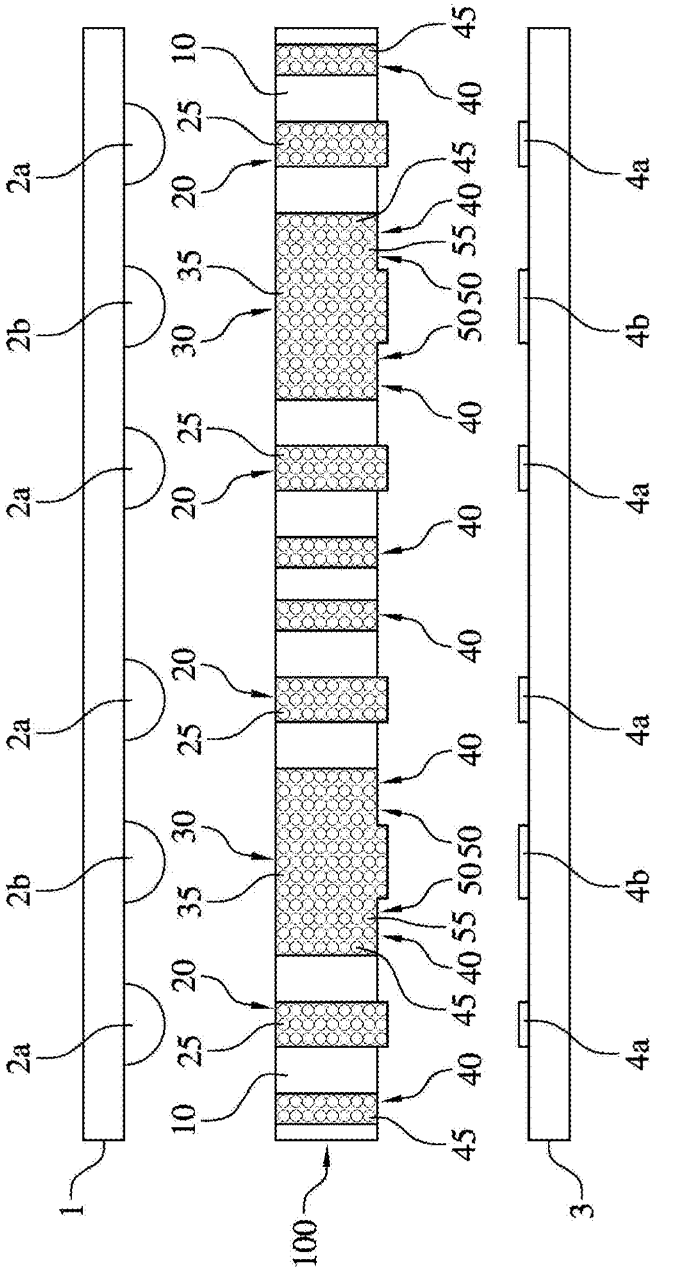
FIG. 2 is a view illustrating a test socket for preventing signal loss according to an exemplary embodiment of the present disclosure.
Figure 3:
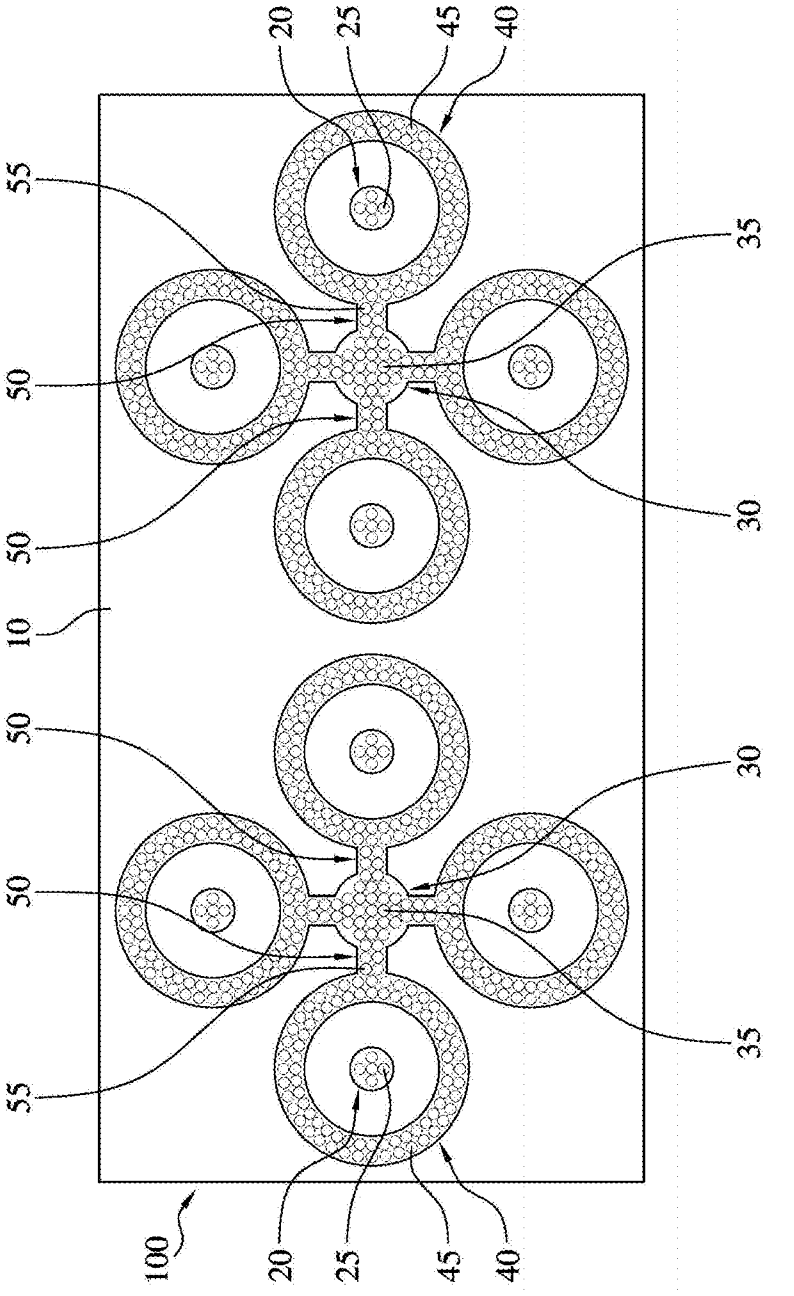
FIG. 3 is a view illustrating the test socket for preventing signal loss illustrated in FIG. 2 as viewed from above.

FIG. 2 is a view illustrating a test socket for preventing signal loss according to the exemplary embodiment of the present disclosure, and FIG. 3 is a view illustrating the test socket for preventing signal loss illustrated in FIG. 2 as viewed from above.

A test socket 100 for preventing signal loss is disposed between terminals facing each other and serves to electrically connect the terminals to each other. For example, the test socket 100 for the signal loss prevention serves to electrically connect the terminals 4*a* and 4*b* of a test device 3 and the terminals 2*a* and 2*b* of a semiconductor element 1, respectively.

As shown in FIGS. 2 and 3, the test socket 100 for the signal loss prevention according to the exemplary embodiment of the present disclosure includes an insulating support part 10, first conductive parts 20, a second conductive part 30, shield parts 40, and connection parts 50. Although eight first conductive parts 20 are illustrated in FIG. 3, the number of first conductive parts 20 may also be tens to thousands.

The insulating support part 10 is generally in the form of a plate and forms the overall appearance of the test socket 100 for the signal loss prevention. The insulating support part 10 serves to support the first conductive parts 20, the second conductive part 30, the shield parts 40, and the connection parts 50. In addition, the insulating support part 10 serves to insulate the first conductive parts 20 from the second conductive part 30, the shield parts 40, and the connection parts 50. The insulating support part 10 includes the first conductive parts 20, the second conductive part 30, the shield parts 40 and the connection parts 50, which are built thereinto.

The insulating support part 10 may be formed from various types of polymer materials. For example, the insulating support part 10 may be implemented with diene type rubber such as silicone, polybutadiene, polyisoprene, SBR, NBR, etc., and hydrogen compounds thereof. In addition, the insulating support part 10 may also be implemented with a block copolymer such as a styrene-butadiene block copolymer, a styrene-isoprene block copolymer, etc., and hydrogen compounds thereof. In addition, the insulating support part 10 may be implemented with chloroprene, urethane rubber, polyethylene type rubber, epichlorohydrin rubber, ethylene-propylene copolymer, ethylene propylene diene copolymer, etc. In addition, the insulating support part 10 may be implemented with polytetrafluoroethylene (PTFE) resin. It is preferable that the insulating support part 10 is implemented with silicone resin or polytetrafluoroethylene (PTFE) resin. The insulating support part 10 is able to be obtained by curing a liquid resin.

Each first conductive part 20 serves to electrically connect power terminals or signal terminals 2*a* and 4*a* to each other, which are facing each other. Each first conductive part 20 is provided with a plurality of first conductive particles 25 embedded within the interior of the insulating support part 10.

As shown in FIG. 2, at least one end part of the both end parts of each first conductive part 20 may protrude outside the insulating support part 10. This is because the end part of each first conductive part 20 should protrude more than the insulating support part 10 to facilitate contact with the terminal 4*a*.

The first conductive particles 25 are arranged in a longitudinal direction of each first conductive part 20 (i.e., the thickness direction of the insulating support part 10). The first conductive particles 25 contact each other to provide conductivity in the longitudinal direction of each first conductive part 20. When pressure is applied in the longitudinal direction of each first conductive part 20 in order to test the semiconductor element 1, each first conductive part 20 is compressed in the longitudinal direction thereof. In addition, as the first conductive particles 25 come closer to each other, the electrical conductivity in the longitudinal direction of each first conductive part 20 increases further.

The first conductive particles 25 may be implemented with a single conductive metal material such as iron, copper, zinc, chromium, nickel, silver, cobalt, aluminum, etc., or an alloy of two or more of these metal materials. In addition, the first conductive particles 25 may be implemented by using a method of coating the surface of core metal with a metal having excellent conductivity, such as gold, silver, rhodium, palladium, or platinum, or an alloy of silver and gold, an alloy of silver and rhodium, or an alloy of silver and palladium, and so on.

In order to simplify the manufacturing method, it is preferable that the first conductive particles 25 are particles having magnetism. For example, the first conductive particles 25 may be implemented by using a method of coating the surface of core metal made of a magnetic metal with a highly conductive metal.

Each second conductive part 30 serves to electrically connect the ground terminals 2*b* and 4*b* to each other, which are facing each other. Each second conductive part 30 is provided with a plurality of second conductive particles 35 embedded within the interior of the insulating support part 10.

As shown in FIG. 2, among both end parts of the second conductive part 30, at least one end part of the second conductive part 30 may protrude outside the insulating support part 10. This is because the at least one end part of the second conductive part 30 should protrude more than the insulating support part 10 to facilitate contact with the terminal 4*b*.

The second conductive particles 35 are arranged in a longitudinal direction of the second conductive part 30 (i.e., the thickness direction of the insulating support part 10). The second conductive particles 35 contact each other to provide conductivity in the longitudinal direction of the second conductive part 30. When pressure is applied in the longitudinal direction of the second conductive part 30 in order to test the semiconductor element 1, the second conductive part 30 is compressed in the longitudinal direction thereof. In addition, as the second conductive particles 35 come closer to each other, the electrical conductivity in the longitudinal direction of the second conductive part 30 increases further.

As the same as the case of first conductive particles 25, the second conductive particles 35 may be implemented with a single conductive metal material such as iron, copper, zinc, chromium, nickel, silver, cobalt, aluminum, etc., or an alloy of two or more of these metal materials. In addition, the second conductive particles 35 may also be implemented by using a method of coating the surface of core metal with a metal having excellent conductivity, such as gold, silver, rhodium, palladium, platinum, or silver, or an alloy of silver and gold, an alloy of silver and rhodium, or an alloy of silver and palladium, and so on.

In order to simplify the manufacturing method, as the same as the case of first conductive particles 25, it is preferable that the second conductive particles 35 are particles having magnetism. For example, the first conductive particles 25 may be implemented by using a method of coating the surface of core metal made of a magnetic metal with a highly conductive metal.

The second conductive particles 35 may be the same particles as the first conductive particles 25.

The shield parts 40 serve to minimize signal loss of the respective first conductive parts 20. Each shield part 40 is in a tubular shape that surrounds the side surface of a corresponding first conductive part 20. Each shield part 40 may be in a cylindrical shape, as shown in FIG. 3, or may also be in a shape of a polygonal cylinder such as a tetragon or hexagon. The inner surface of each shield part 40 is spaced apart from an outer surface of the corresponding first conductive part 20 by a predetermined distance. Each shield part 40 is provided with a plurality of third conductive particles 45 embedded within the interior of the insulating support part 10.

The third conductive particles 45 are arranged in a longitudinal direction of each corresponding shield part 40 (i.e., the thickness direction of the insulating support part 10). The third conductive particles 45 contact each other to provide conductivity in the longitudinal direction of each shield part 40.

As the same as the case of first conductive particles 25, the third conductive particles 45 may be implemented with a single conductive metal material such as iron, copper, zinc, chromium, nickel, silver, cobalt, aluminum, etc., or an alloy of two or more of these metal materials. In addition, the third conductive particles 45 may be implemented by using a method of coating the surface of core metal with a metal having excellent conductivity, such as gold, silver, rhodium, palladium, platinum, or an alloy of silver and gold, an alloy of silver and rhodium, or an alloy of silver and palladium, and so on.

In order to simplify the manufacturing method, as the same as the case of first conductive particles 25, it is preferable that the third conductive particles 45 are particles having magnetism. For example, the first conductive particles 25 may be implemented by using a method of coating the surface of core metal made of a magnetic metal with a highly conductive metal.

The third conductive particles 45 may be the same particles as the first conductive particles 25.

The connection parts 50 serve to electrically connect the respective shield parts 40 and the second conductive part 30 to each other. Each connection part 50 is provided with a plurality of fourth conductive particles 55 embedded within the interior of the insulating support part 10.

The fourth conductive particles 55 are arranged in a longitudinal direction of each connection part 50 (i.e., the thickness direction of the insulating support part 10). The fourth conductive particles 55 contact each other to provide conductivity in the longitudinal direction of each connection part 50.

As the same as the case of first conductive particles 25, the fourth conductive particles 55 may be implemented with a single conductive metal material such as iron, copper, zinc, chromium, nickel, silver, cobalt, aluminum, etc., or an alloy of two or more of these metal materials. In addition, the fourth conductive particles 55 may be implemented by using a method of coating the surface of core metal with a metal having excellent conductivity, such as gold, silver, rhodium, palladium, platinum, or an alloy of silver and gold, an alloy of silver and rhodium, or an alloy of silver and palladium, and so on.

In order to simplify the manufacturing method, as the same as the case of first conductive particles 25, it is preferable that the fourth conductive particles 55 are particles having magnetism. For example, the first conductive particles 25 may be implemented by using a method of coating the surface of core metal made of a magnetic metal with a highly conductive metal.

The fourth conductive particles 55 may be the same particles as the first conductive particles 25.

The second conductive part 30 is in contact with the ground terminals 2*b* and 4*b*, and the shield parts 40 and the second conductive part 30 are electrically connected to each other through the corresponding connection parts 50, so the shield parts 40 are also connected to the ground.

Hereinafter, an example of a manufacturing method for a test socket 100 for preventing signal loss described above will be described.

First, a mixture of liquid resin and magnetic conductive particles is injected into a mold.

Next, by using a magnet, magnetic field lines are allowed to pass only through positions corresponding to first conductive parts 20, a second conductive part 30, shield parts 40, and connection parts 50, so that conductive particles are gathered together only at the positions corresponding to the first conductive parts 20, the second conductive part 30, the shield parts 40, and the connection parts 50.

In addition, at the same time as magnetic field lines are formed, heat is applied to the liquid resin to cure the liquid resin. Then, as shown in FIGS. 2 and 3, the liquid resin is cured so that the conductive particles are aligned in a thickness direction of the test socket 100 for the signal loss prevention at the positions corresponding to the first conductive parts 20, the second conductive part 30, the shield parts 40, and the connection parts 50, thereby manufacturing the test socket 100 for the signal loss prevention.

The cured liquid resin becomes an insulating support part 10, and the conductive particles embedded in the insulating support part 10 are formed within each of the first conductive parts 20, the second conductive part 30, the shield parts 40, and the connection parts 50, depending on their positions.

The exemplary embodiment described above merely describes a preferred exemplary embodiment of the present disclosure, and the scope of the present disclosure is not limited to the described exemplary embodiment. It should be understood that various changes, modifications, or substitutions may be made by those skilled in the art within the technical spirit and scope of the claims of the present disclosure, and such exemplary embodiments are included within the scope of the present disclosure.

DESCRIPTION OF THE REFERENCE NUMERALS IN THE DRAWINGS

100: test socket for preventing signal loss
10: insulating support part
20: first conductive parts
25: first conductive particles
30: second conductive part
35: second conductive particles
40: shield parts
45: third conductive particles
50: connection parts
55: fourth conductive particles

The invention claimed is:

1. A test socket for preventing signal loss, the test socket being disposed between power or signal terminals facing each other and between ground terminals facing each other to electrically connect the respective facing terminals to each other, and the test socket comprising:

an insulating support in a form of a plate;

a plurality of first conductors each provided with a plurality of first conductive particles arranged along a thickness direction of the insulating support inside the insulating support, the plurality of first conductors each having both ends thereof respectively in contact with the facing power or signal terminals;

a second conductor provided with a plurality of second conductive particles arranged along the thickness direction of the insulating support inside the insulating support, the second conductor having both ends thereof respectively in contact with the facing ground terminals and being electrically separated from each of the plurality of first conductors by the insulating support;

a plurality of shields each provided with a plurality of third conductive particles arranged along the thickness direction of the insulating support inside the insulating support, each of the plurality of shields surrounding a corresponding one of the plurality of first conductors in a tubular shape, each of the plurality of shields being electrically separated from the corresponding one of the plurality of first conductors by the insulating support, each of the plurality of first conductors being electrically connected to the second conductor; and a plurality of connectors each provided with a plurality of fourth conductive particles arranged along the thickness direction of the insulating support, the plurality of connectors electrically connecting the second conductor and the plurality of shields, wherein the plurality of shields are electrically separated from each other by the insulating support.

2. The test socket of claim 1, wherein at least one surface of each of the plurality of first conductors protrudes outside the insulating support.

3. The test socket of claim 1, wherein at least one surface of the second conductor protrudes outside the insulating support.

4. The test socket of claim 1, wherein the insulating support comprises a silicone-based resin or a polytetrafluoroethylene (PTFE)-based resin.

* * * * *